United States Patent
Lau et al.

(10) Patent No.: US 7,615,255 B2
(45) Date of Patent: Nov. 10, 2009

(54) METAL DUPLEX METHOD

(75) Inventors: Danny Lau, Fanling (HK); Raymund W. M. Kwok, Kowloon (HK)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 11/511,155

(22) Filed: Aug. 28, 2006

(65) Prior Publication Data

US 2007/0054138 A1 Mar. 8, 2007

Related U.S. Application Data

(60) Provisional application No. 60/714,575, filed on Sep. 7, 2005.

(51) Int. Cl.
- C25D 5/50 (2006.01)
- B05D 3/02 (2006.01)
- B32B 15/01 (2006.01)
- H01L 23/532 (2006.01)

(52) U.S. Cl. .............. 427/383.7; 427/376.8; 205/226; 428/648; 428/675; 428/929; 428/939; 257/677; 148/537

(58) Field of Classification Search .............. 428/680, 428/646, 647, 648, 215, 336, 704; 427/375, 427/438, 376.1, 376.4, 376.7, 383.1, 250, 427/123, 126.1, 120, 124; 205/224, 225, 205/226, 227, 252, 271

See application file for complete search history.

(56) References Cited

U.S. PATENT DOCUMENTS

| | | | |
|---|---|---|---|
| 4,049,471 A | 9/1977 | Koontz | |
| 4,053,373 A | 10/1977 | McMullen et al. | |
| 4,102,755 A | 7/1978 | Brugger et al. | |
| 4,186,064 A | 1/1980 | Morrissey | |
| 4,199,416 A | 4/1980 | Middleton et al. | |
| 4,230,493 A | 10/1980 | Felten | |
| 4,626,479 A * | 12/1986 | Hosoi et al. | 428/663 |
| 4,880,507 A | 11/1989 | Toben et al. | |
| 4,888,574 A | 12/1989 | Rice et al. | |
| 4,994,155 A | 2/1991 | Toben et al. | |
| 5,164,069 A | 11/1992 | Cerwonka | |
| 5,174,887 A | 12/1992 | Federman et al. | |
| 5,182,172 A | 1/1993 | Tucker | |
| 5,235,139 A * | 8/1993 | Bengston et al. | 174/257 |
| 5,397,599 A * | 3/1995 | Chao et al. | 427/306 |
| 5,492,615 A | 2/1996 | Houman | |
| 5,667,849 A | 9/1997 | Carey, II et al. | |
| 5,675,177 A | 10/1997 | Abys et al. | |
| 5,871,631 A | 2/1999 | Ichiba et al. | |
| 5,916,696 A | 6/1999 | Abys et al. | |
| 6,036,833 A | 3/2000 | Tang et al. | |
| 6,210,556 B1 | 4/2001 | Toben et al. | |
| 6,259,161 B1 * | 7/2001 | Wu et al. | 257/766 |
| 6,287,896 B1 | 9/2001 | Yeh et al. | |
| 6,452,258 B1 | 9/2002 | Abys et al. | |
| 6,613,451 B1 | 9/2003 | Asahara et al. | |
| 6,736,886 B2 | 5/2004 | Suda et al. | |
| 6,773,568 B2 | 8/2004 | Egli et al. | |
| 6,797,142 B2 | 9/2004 | Crosby | |
| 6,858,122 B2 | 2/2005 | Kondo et al. | |
| 7,238,432 B2 * | 7/2007 | Haketa | 428/672 |
| 2002/0185716 A1 | 12/2002 | Abys et al. | |
| 2002/0192492 A1 | 12/2002 | Abys et al. | |
| 2003/0025182 A1 | 2/2003 | Abys et al. | |
| 2003/0042047 A1 * | 3/2003 | Shimizu | 174/263 |
| 2003/0151141 A1 * | 8/2003 | Matsuki et al. | 257/746 |
| 2003/0218058 A1 * | 11/2003 | Shaw et al. | 228/230 |
| 2004/0099340 A1 | 5/2004 | Zhang et al. | |
| 2004/0211817 A1 * | 10/2004 | Jin et al. | 228/42 |
| 2005/0048309 A1 | 3/2005 | Haketa | |
| 2005/0249969 A1 | 11/2005 | Xu et al. | |
| 2007/0052105 A1 * | 3/2007 | Lau et al. | 257/766 |

FOREIGN PATENT DOCUMENTS

| | | | |
|---|---|---|---|
| EP | 0 160 761 | | 2/1989 |
| JP | 07-041985 | * | 2/1995 |
| JP | 1995041985 A | | 2/1995 |
| JP | 2001-274539 | * | 10/2001 |
| JP | 2005-109373 | * | 4/2005 |
| WO | 2004/050959 A2 | | 6/2004 |

* cited by examiner

*Primary Examiner*—John J Zimmerman
(74) *Attorney, Agent, or Firm*—John J. Piskorski

(57) ABSTRACT

Methods and articles are disclosed. The methods are directed to depositing nickel duplex layers on substrates to inhibit tin and tin alloy surface oxidation and improve solderability of the substrates.

4 Claims, No Drawings

METAL DUPLEX METHOD

The present invention is directed to a metal duplex with a tin or tin alloy layer and method of making the metal duplex with the tin or tin alloy layer. More specifically, the present invention is directed to a metal duplex with a tin or tin alloy layer and method of making the metal duplex with the tin or tin alloy layer for inhibiting tin and tin alloy corrosion and improving tin and tin alloy solderability.

Prevention of corrosion of tin and tin alloys is a challenging problem in numerous industries. The corrosion of tin and tin alloys has been especially problematic in the electronic materials industry where corrosion may lead to faulty electrical contact between components in electronic devices. For example, electroplated tin and tin alloy coatings have been used in electronics and other applications such as wire, and steel strip for many years. In electronics, they have been used as a solderable and corrosion resistive surface for contacts and connectors. They are also used in lead finishes for integrated circuit (IC) fabrication.

IC devices, having IC units, lead frames and passive components, such as capacitors and transistors, find wide use in products including consumer electronics, household appliances, computers, automobiles, telecommunications, robotics and military equipment. The IC unit encompasses IC chips and hybrid circuit nodules which include one or more or the IC chips and other electronic components on a plastic or ceramic support base.

Lead frames or connectors are a means to electrically interconnect an IC unit to external circuitry. The lead frame is formed from electrically conductive material such as copper or copper alloys, or by stamping or etching a metal blank into a plurality of leads defining a central area in which the IC unit is mounted.

The lead frames often have a surface finish of tin or tin alloy. There are several attachment techniques by which the lead frames connect the IC units in an assembly. These include wirebonding, soldering, die-attach and encapsulation. Typically soldering is the means of joining the IC to the assembly. In all instances attachment requires a particular quality of the lead frame surface. Typically this means that the surface is oxide free and ready for interaction with other components such as gold or aluminum wire, silver filled epoxy or solder.

One problem is long term solderability, defined as the ability of the surface finish to melt and make a good solder joint to other components without defects that impair the electrical or mechanical connection. Generally, soldering is an attachment procedure that usually involves three materials: (1) the substrate, (2) the component or other device which is desired to be attached to the substrate, and (3) the soldering material itself.

There are many factors that determine good solderability, the three most important of which are extent of surface oxide formation (corrosion), amount of co-deposited carbon, and extent of intermetallic compound formation. Surface oxide formation is a natural occurring process because it is thermodynamically favorable. The rate of formation of the surface oxide depends on temperature and time. The higher the temperature and the longer the exposure time, the thicker the surface oxide formed. In electroplated tin or tin alloy coatings or deposits, surface oxide formation also depends on the surface morphology of the coating or deposit. When comparing pure tin to tin alloy coatings, for example, tin alloys generally form less or thinner surface oxides when all other conditions are equal.

Co-deposited carbon is determined by the plating chemistry one chooses to use. Bright finishes contain higher carbon contents than matte finishes. Matte finishes are normally rougher than bright finishes, and provide an increased surface area which results in the formation of more surface oxides than typically are formed with bright finishes.

Intermetallic compound formation is a chemical reaction between the tin or tin alloy coating and the substrate. The rate of formation depends on temperature and time as well. Higher temperatures and longer times result in a thicker layer of intermetallic compounds.

To ensure solderability, it is important to 1) deposit a sufficient layer of tin or tin alloy such that surface oxide or intermetallic compound formation does not consume the entire layer, and 2) to prevent or minimize exposure of the tin plated surface to elevated temperatures for extended periods of time.

It is relatively easy to achieve 1), but it is difficult to achieve 2). The temperature and the time of subsequent post treatment after plating of a tin or tin alloy deposit are typically dictated by the assembly specifications and existing manufacturing layout and practice. For example, in "two tone" lead frame technology, after the tin or tin alloy plating, the entire IC unit goes through many process steps (i.e., a long period of time for such treatments) which require multiple thermal excursions at temperatures as high as 175° C. Inevitably, more and thicker surface oxide forms, and this in turn reduces the solderability of the tin or tin alloy deposit. In current processing, these additional steps may not be omitted since the final components and assemblies would not be complete. Therefore, it is desirable to find ways to prevent or minimize surface oxide formation on such parts.

One method of addressing the surface oxide problem is to introduce a conformal coating on the surface of the tin or tin alloy deposits. This technology may be summarized in two general categories: one that applies a precious metal coating and the other that applies an organic coating. The first category is undesirable for the protection of tin or tin alloy deposits because it introduces an expensive, extra step. The second category also is undesirable because it may introduce impurities onto other critical areas of the lead frame or electrical component due to the non-selective nature of the organic coating that is deposited. Such impurities are detrimental to subsequent lead frame and IC assembly processes.

The presence of nickel products, such as nickel oxide, at the surface of leads also is of concern from the wirebonding and solderability standpoint. Nickel oxides interfere with wirebonding and soldering and they are difficult to remove with conventional acid cleaning.

In addition, many applications include thermal exposure of coated lead frames. Diffusion of metal between layers under thermal aging conditions may cause a loss of surface quality if an underlying metal diffuses into a noble surface layer such as nickel into gold.

U.S. 2004/0099340 (WO 2004/050959) to Zhang et al. attempts to address the surface oxide problem on metal and metal alloy deposits by incorporating trace amounts of phosphorous in the deposits. For example, in nickel deposits the amount of phosphorous is on the order of 200 ppm or less and for tin and tin alloys it is on the order of 50 ppm or less. Zhang et al. allege that incorporating trace amounts of phosphorous into the deposits reduces the formation of surface oxide on the deposits. The phosphorous compounds are included in the metal and metal alloy electroplating baths, and are co-deposited with the metal or metal alloy.

Although there are methods which attempt to address the surface oxide problem on metal deposits, there is still a need for improved methods for inhibiting surface oxide formation on metal finishes and improving solderability.

Methods include depositing a nickel layer on a substrate, depositing a layer of nickel phosphorous on the nickel layer and depositing tin or tin alloy on the nickel phosphorous layer. The combination of the nickel and nickel phosphorous layers inhibit or prevent oxide formation on the surface finish as well as underlying metal layers, thus improving solderability. Oxide formation is undesirable since it may cause electrical malfunctions of metal components in electrical devices compromising the performance of the devices.

In another aspect, methods include depositing 1 micron to 10 microns of a nickel layer on a substrate, depositing 0.1 micron to 5 microns of a nickel phosphorous layer on the nickel layer, and depositing a tin or tin alloy layer on the nickel phosphorous layer.

In a further aspect, articles include a nickel layer on a substrate, a nickel phosphorous layer on the nickel layer and a tin or tin alloy layer on the nickel phosphorous layer.

As used throughout this embodiment, the following abbreviations have the following meanings, unless the context clearly indicates otherwise: ° C.=degrees Centigrade; g=gram; mg=milligram; L=liter; ml=milliliter; Å=angstroms=$1 \times 10^{-4}$ microns; ASD=amperes/dm$^2$; and wt %=weight percent. The terms "depositing" and "plating" are used interchangeably throughout this specification. All numerical ranges are inclusive and combinable in any order, except where it is logical that such numerical ranges are constrained to add up to 100%.

Methods include depositing nickel on a substrate, depositing a layer of nickel phosphorous on the nickel and depositing tin or tin alloy on the nickel phosphorous layer. The combination of the nickel and nickel phosphorous layers inhibit or prevent oxide formation on tin and tin alloy surface layers as well as underlying metal layers, thus improving solderability. Oxide formation is undesirable since it may cause electrical malfunctions of metal components in electrical devices compromising the performance of the devices. Additionally, the combination of the nickel and nickel phosphorous layers reduces or inhibits the migration of nickel into more noble metals.

Optionally, prior to metallization the substrate may be cleaned. Any suitable cleaning process may be used which is acceptable in the metallization arts. Typically, the substrate is ultrasonically cleaned in a cleaning solution. Such cleaning solutions may include silicate compounds, alkali metal carbonates and other compounds such as alkali metal hydroxides, glycol ethers and one or more chelating agents. Cleaning may be done at temperatures from 30° C. to 80° C.

Optionally, following the cleaning step, the substrate may be activated with a suitable acid such as a mineral acid. Dilute concentrations of mineral acids are used. An example of such an acid is sulfuric acid. However, other mineral acids may be used such a hydrochloric acid and nitric acid. The acids are used at conventional concentrations well known in the art. Activation typically is done at temperatures from room temperature to 30° C.

The substrate is then plated with a deposit of nickel metal. Bath temperatures range from 30° C. to 70° C. or such as from 40° C. to 60° C.

Any suitable nickel plating bath may be used to deposit the nickel layer on the substrate. Such nickel plating baths include one or more sources of nickel ions. Sources of nickel ions include, but are not limited to, nickel halides such as nickel chloride, nickel sulfate and nickel sulfamate. Such sources of nickel ions are included in the nickel baths in amounts of 50 gm/L to 500 gm/L, or such as from 100 gm/L to 250 gm/L.

In addition to the one or more sources of nickel ions, the nickel plating baths may include one or more additives. Such additives include, but are not limited to, brighteners, grain refiners, levelers, surface active agents, antipitting agents, chelating agents, buffers, biocides and other additives known to those of skill in the art to tailor the bath to a desired bright or matt finish and throwing power.

Brighteners include, but are not limited to, aromatic sulfonates, sulfonamides, sulfonimides, aliphatic and aromatic-aliphatic olefinically or acetylenically unsaturated sulfonates, sulfonamides and sulfonimides. Examples of such brighteners are sodium o-sulfobenzimide, disodium 1,5-naphthalene disulfonate, trisodium 1,3,6-naphthalene trisulfonate, sodium benzene monosulfonate, dibenzene sulfonamide, sodium allyl sulfonate, sodium 3-chloro-2-butene-1-sulfonate, sodium β-styrene sulfonate, sodium propargyl sulfonate, monoallyl sulfamide, diallyl sulfamide and allyl sulfonamide. Such brighteners may be used in conventional amounts such as 0.5 g/L to 10 g/L, or such as 2 g/L to 6 g/L.

Other brighteners include, but are not limited to, reaction products of epoxides with alphahydroxy acetylenic alcohols such as diethoxylated 2-butyne-1,4-diol or dipropoxylated 2-butyne-1,4-diol, N-heterocyclics, other acetylenic compounds, active sulfur compounds and dye-stuffs. Examples of such brighteners are 1,4-di-(β-hydroxyethoxy)-2-butyne, 1,4-di-(β-hydroxy-γ-chloropropoxy)-2-butyne, 1,4-di-(β-,γ-epoxypropoxy)-2-butyne, 1,4-di-(β-hydroxy-γ-butenoxy)-2-butyne, 1,4-di-(2'-hydroxy-4'-oxa-6'-heptenoxy)-2-butyne, N-(2,3-dichloro-2-propenyl)-pyridinium chloride, 2,4,6-trimethyl N-propargyl pyridinium bromide, N-allylquinaldinium bromide, 2-butyne-1,4-diol, propargyl alcohol, 2-methyl-3-butyn-2-ol, quinaldyl-N-propanesulfonic acid betaine, quinaldine dimethyl sulfate, N-allylpyridinium bromide, isoquinaldyl-N-propanesulfonic acid betaine, isoquinaldine dimethyl sulfate, N-allylisoquinaldine bromide, disulfonated 1,4-di-(β-hydroxyethoxy)-2-butyne, 1-(β-hydroxyethoxy)-2-propyne, 1-(β-hydroxypropoxy)-2-propyne, sulfonated 1-(β-hydroxyethoxy)-2-propyne, phenosafranin and fuchsin. Such brighteners are included in conventional amounts such as 5 mg/L to 1000 mg/L, or such as from 20 mg/L to 500 mg/L.

Any suitable surface active agent may be used. Such surface active agents include, but are not limited to, ionic surfactants such as cationic and anionic surfactants, non-ionic surfactants and amphoteric surfactants. Surfactants may be used in conventional amounts such as, for example, 0.05 gm/L to 30 gm/L, or such as from 1 gm/L to 20 gm/L or such as from 5 gm/L to 10 gm/L.

An example of a suitable surfactant is naphthalene sulfonated with 1 to 8 sulfonic acid groups (—SO$_3$H). Examples of such surfactants are naphthalene-1,3,6-trissulfonic acid and naphthalene-1,3,7-trissulfonic acid. The alkali metal salts such as the sodium and potassium salts also may be used.

Examples of other suitable surfactants are salts of alkyl hydrogen sulfates such as sodium lauryl sulfate, sodium lauryl ether-sulfate and sodium di-alkylsulfosuccinates. Examples of other surfactants which may be used are quaternary ammonium salts including perfluorinated quaternary amines such as perfluoro dodecyl trimethyl ammonium fluoride.

Suitable chelating agents include, but are not limited to, amino carboxylic acids, polycarboxylic acids and polyphosphonic acids. Such chelating agents may be used in conventional amounts such as, for example, 0.01 moles/L to 3 moles/L or such as from 0.1 moles/L to 0.5 moles/L.

The pH of the nickel baths may range from 1 to 10, or such as from 3 to 8. The pH of the nickel baths may be maintained by a variety of means. Any desired acid or base may be used, and any inorganic acid, organic acid, inorganic base, or organic base may be used. Besides acids such as sulfuric acid, hydrochloric acid, or sulfamic acid, acids used as chelating agents such as acetic acid, amino acetic acid or ascorbic acid also may be used. Besides inorganic bases such as sodium hydroxide or potassium hydroxide and organic bases such as various types of amines, bases such as nickel carbonate also may be used. In addition, a pH buffering ingredient such as boric acid may be used if the pH tends to fluctuate due to operating conditions. The buffers may be added in amounts as needed to maintain a desired pH.

Other additives may be added to the nickel metal plating baths which are conventional and well known to those of skill in the art. They may be used in conventional amounts to tailor the nickel layer to a desired matt, semi-bright or bright finish.

Nickel is deposited on the substrate until a nickel layer of from 1 micron to 10 microns, or such as from 2 microns to 5 microns is formed on the substrate. The nickel layer is then plated with a layer of nickel phosphorous using a nickel phosphorous bath.

The nickel phosphorous bath includes one or more sources of nickel ions as described above, and may include one or more of the additives as described above. In addition, the nickel phosphorous bath includes one or more sources of phosphorous. Any suitable phosphorous acid or phosphoric acid or salt thereof and mixtures may be used. Phosphorous acids and phosphoric acids and their salts are included in the baths in amounts of 5 gm/L to 100 gm/L, or such as from 10 gm/L to 80 gm/L, or such as from 20 gm/L to 50 gm/L. Phosphorous acid has the general formula: $H_3PO_3$ and also is known as orthophosphorous acid. Phosphoric acids include, but are not limited to, inorganic phosphoric acids such as phosphoric acid ($H_3PO_4$), also known as orthophosphoric acid. Polyphosphoric acids also may be used. Inorganic phosphoric acids may be represented by the formula: $H_{n+2}P_nO_{3n+1}$, where n is an integer of 1 or greater. When n is an integer of 2 or greater, the formula represents a polyphosphoric acid. When the inorganic phosphoric acid is a polyphosphoric acid, typically, n is an integer such that the polyphosphoric acid has an average molecular weight of 1 10 to 1,500 atomic weight units. Typically, phosphorous acid is used.

Salts of phosphoric acids such as alkali metal phosphates and ammonium phosphate may be used. Alkali metal phosphates include dibasic sodium phosphate, tribasic sodium phosphate, dibasic potassium phosphate and tribasic potassium phosphate. Salts of the polyphosphoric acids also may be used. Mixtures of the inorganic phosphoric acids and their salts also may be used. Such acids are commercially available or may be made according to methods described in the literature.

The nickel phosphorous layer is deposited on the nickel layer at the same bath temperatures as the nickel layer is deposited on the substrate. Deposition continues until a nickel phosphorous layer of 0.1 microns to 5 microns or such as from 0.2 microns to 1 micron is deposited on the nickel layer to form a duplex.

Typically, the weight ratio of nickel to nickel phosphorous in the duplex is from 2:1 to 8:1. The nickel and nickel phosphorous layers may be deposited by any suitable electrolytic deposition method known in the art. Conventional plating apparatus may be used to deposit the nickel and nickel phosphorous layers. Current densities may range from 1 ASD to 20 ASD, or such as from 5 ASD to 15 ASD.

Typically, the nickel and nickel phosphorous duplex layer is 2 to 3 microns thick. After the nickel and nickel phosphorous layers are deposited on the substrate, a tin or tin alloy surface finish is deposited on the nickel phosphorous layer. Any suitable tin or tin alloy bath may be used. Sources of tin ions for the baths include, but are not limited to, tin sulfate, tin alkyl sulfonates, such as tin sulfonate, tin alkanol sulfonic acid, and tin halides, such as tin chloride. The tin bath also may include electrolytes such as sulfuric acid, alkyl sulfonates, alkanol sulfonates and halide salts to provide an electro-conductive matrix. Surfactants also may be included as well as other conventional additives to provide a desirable tin layer. The amounts of the components are conventional and are well known in the art and may be obtained from the literature. U.S. Pat. No. 5,174,887 and U.S. Pat. No. 5,871,631 disclose suitable tin electroplating baths. U.S. Pat. No. 4,880,507 and U.S. Pat. No. 4,994,155 disclose suitable tin-lead plating baths. In addition to tin-lead, other tin alloys may be used including, but not limited to, tin-copper, tin-copper-silver and tin-silver, tin-bismuth, tin-nickel, tin-antimony, tin-indium and tin-zinc. Bath formulations for depositing such tin alloys are known in the art and may be obtained from the literature.

The tin and tin alloy may be deposited by any suitable method known in the art. Typically the tin and tin alloys are deposited on the nickel phosphorous layer electrolytically. Typically, tin or tin alloy deposition is carried out until a tin or tin alloy layer of 10 microns to 50 microns is plated on the nickel phosphorous layer.

Generally, the tin and tin alloy bath temperatures range from 15° C. to 40° C., or such as from 25° C. to 30° C. The current density is typically from 1 ASD to 35 ASD, or such as from 5 ASD to 30 ASD, or such as from 10 ASD to 20 ASD. However, any conventional current density used to plate tin and tin alloys may be used. Many such plating conditions are disclosed in the literature.

After the tin or tin alloy layer is deposited on the nickel phosphorous layer, the tin or tin alloy layer undergoes a reflow process. Reflow may be by heating, by vapor phase reflow, laser reflow, plasma, oven melting and passing an electrical current through the tin or tin alloy, or by other methods of heating the tin or tin alloys above their liquidus temperature. Such reflow processes are well known in the art.

Typically, reflow is done in a conduction/convection oven. Temperatures for the reflow may range from 100° C. to 350° C. The tin or tin alloy may remain for a given period of time at a temperature zone within the range and then heated to the next higher temperature zone. Typically the tin or tin alloys remain at a temperature zone for 20 seconds to 50 seconds. At the end of the reflow cycle, the tin or tin alloy is cooled to room temperature.

The article formed by the methods described above includes a substrate plated with a nickel layer and a nickel phosphorous layer over the nickel layer to form the duplex. Phosphorous content of the nickel phosphorous layer may range from 0.1 wt % to 15 wt %, or such as from 1 wt % to 10 wt %, or such as from 3 wt % to 8 wt %. A tin or tin alloy layer may be deposited over the nickel phosphorous layer to form an article. The duplex layers composed of the nickel and nickel phosphorous layers inhibit the oxidation of tin and tin alloys plated over them. Additionally, the inhibition of oxide formation on the tin or tin alloy layer improves the solderability of the article. Connectors soldered to the tin or tin alloy coated articles are more secure and less likely to separate than tin or tin alloy coated articles with surface oxidation.

Tin as well as tin alloys may form tin oxides (SnO and $SnO_2$) after reflow. This is noticeable on the deposited tin after the reflow process by a discoloration of the tin surface. The longer the exposure of the reflowed tin to oxygen and the higher the temperature, the more noticeable is the discoloration. Typically the discoloration is observable as a white to yellow tint on the surface of the tin. In more severe cases of oxidation, the tin may appear brown and even purple after reflow. Oxidation of the tin may result in poor electrical conduction or shorts in electronic devices where the tin is plated such as in printed wiring boards and lead frames. In addition, the presence of oxidation on the tin or tin alloy surface compromises any subsequent soldering process. Poor soldering may result in separation of the soldered parts resulting in malfunction of the electronic device. The duplex reduces or inhibits the undesirable oxidation, thus providing improved soldered connections in contrast to articles with oxidized tin or tin alloy.

The methods may be used to deposit the duplex of nickel and nickel phosphorous on any suitable substrate. Typically such substrates are metals or metal alloys. Suitable metals include, but are not limited to, copper, iron, and their alloys, stainless steel, and precious metals such as gold, platinum, palladium, silver and their alloys. Typically, the substrates are copper, copper alloys, iron and iron alloys. Suitable copper alloys include, but are not limited to, copper-tin, copper-silver, copper-gold, copper-silver-tin, copper-phosphorous-gold, copper-zinc, copper-silver-magnesium, copper-iron-zinc, copper-tin-nickel-silicon, copper-zirconium, copper-iron-phosphorous-zinc and copper-nickel-silicon-magnesium. Suitable iron alloys include, but are not limited to, iron-copper and iron nickel. Such substrates include, but are not limited to, components of electrical devices such as printed wiring boards, connectors, bumps on wafers, lead frames as well as passive components such as resistors and capacitors for IC units.

The following embodiments of the invention are included to further illustrate the invention and are not intended to limit its scope.

EXAMPLE 1 (COMPARATIVE)

Nine (9) copper-tin alloy lead frames were ultrasonically cleaned at 65° C. for 30 seconds in a cleaning solution containing 100 g/L of RONACLEAN™ CP-100, which is a silicate containing cleaning composition obtainable from Rohm and Haas Company, Philadelphia, Pa., U.S.A.

After cleaning, each lead frame was then immersed into a solution of 100 ml/L of technical grade sulfuric acid at room temperature for 10 seconds. Each lead frame was then plated with a nickel layer ranging from 1 micron to 2 microns. The nickel bath used to plate each lead frame had the formula disclosed in Table 1 below.

TABLE 1

| COMPONENT | CONCENTRATION |
|---|---|
| Nickel Sulfamate | 125 g/L |
| Nickel Chloride | 8 g/L |
| Boric Acid | 35 g/L |
| Sulfonated Naphthalene Compound | 0.5 g/L |
| Benzosulfimide Compound | 5 g/L |
| Aldehyde | 0.5 g/L |
| Water | Balance |

The pH of the nickel bath was 4 and the temperature of the bath was 55° C. Each lead frame was placed in a Hull cell containing the electrolytic nickel bath. The lead frame functioned as a cathode and the anode was a sulfur/nickel electrode. The nickel bath was paddle agitated during nickel deposition. The plating apparatus was connected to a conventional rectifier. Current density ranged from 5 ASD to 10 ASD. Nickel deposition was done over a period of 4 seconds to 90 seconds to provide the nickel layers on the lead frames.

Eight (8) of the lead frames with a layer of nickel were then plated with a layer of nickel phosphorous using the bath formulation disclosed in Table 2 below.

TABLE 2

| COMPONENT | CONCENTRATION |
|---|---|
| Nickel Sulfamate | 125 g/L |
| Phosphorous Acid | 50 g/L |
| Boric Acid | 35 g/L |
| Diglyceryl Ether | 30 mg/L |
| Salt of an Alkyl Hydrogen Sulfate | 1 gm/L |
| Water | Balance |

The nickel phosphorous bath had a pH of 1.5 and was at a temperature of 55° C. during electroplating. Nickel phosphorous deposition was done in a Hull cell with paddle agitation at current densities of 5 ASD to 10 ASD. Electroplating was done on eight (8) of the nickel plated lead frames over a period of 16 seconds to 94 seconds to provide nickel phosphorous layers of varying thickness. The thickness of the nickel phosphorous layers ranged from 0.1 micron to 1 micron.

All nine of the lead frames were then electroplated in a Hull cell containing a tin electroplating bath to form a bright tin layer on each of the lead frames. The tin bath included 60 g/L of tin ions from tin methane sulfonate and 250 ml/L of 70% methane sulfonic acid as the matrix. Tin plating was done at room temperature at a current density of 10 ASD for 30 seconds.

All nine of the tin plated lead frames were placed in a Sikama Falcon™ 8500 conduction/convection oven to reflow their tin layers. The temperature profile was 125° C. to 180° C. to 240° C. to 260° C. to 240° C. and then cooled down to room temperature. Each lead frame remained in each temperature zone for 30 seconds.

After reflow, the lead frames were examined for surface oxidation of the tin layer after being exposed to air for 24 hours. A visual inspection scale of 0 to 5 was used. If no visible oxidation was observed, the lead frame was rated 0; and if there was serious discoloration, the lead frame was given a 5. The lead frame which was plated with the nickel layer and not the nickel phosphorous layer was rated a 5 because there was clear discoloration. The lead frame had purple stains across its surface. The remaining eight lead frames which were plated with the duplex of nickel phosphorous layer over the nickel layer were rated 1. They had some white discoloration but did not show the severe discoloration as the lead frame which did not have the duplex layer.

The results showed that the inclusion of a nickel phosphorus layer over a nickel layer reduced surface oxidation of the tin layer in contrast to the lead frame which did not have the duplex.

EXAMPLE 2 (COMPARATIVE)

Nine (9) copper-tin alloy lead frames were ultrasonically cleaned at 65° C. for 30 seconds in a cleaning solution containing 100 g/L of RONACLEAN™ CP-100, which is a silicate containing composition.

After cleaning, each lead frame was then immersed into a solution of 100 ml/L of technical grade sulfuric acid at room temperature for 10 seconds. Each lead frame was then plated with a nickel layer ranging from 1 micron to 2 microns. The nickel bath used to plate each lead frame had the formula disclosed in Table 3 below.

TABLE 3

| COMPONENT | CONCENTRATION |
|---|---|
| Nickel Sulfamate | 125 g/L |
| Nickel Chloride | 8 g/L |
| Aminoacetic Acid | 30 g/L |
| Sulfonated Naphthalene Compound | 1 g/L |
| Benzosulfimide Compound | 5 g/L |
| Aldehyde | 0.5 g/L |
| Water | Balance |

The pH of the nickel bath was 3 and the temperature of the bath was 55° C. Each lead frame was placed in a Hull cell containing the electrolytic nickel bath. The lead frame functioned as a cathode and the anode was a sulfur/nickel electrode. The nickel bath was paddle agitated during nickel deposition. The plating apparatus was connected to a conventional rectifier. Current densities ranged from 5 ASD to 10 ASD. Nickel deposition was done over a period of 4 seconds to 90 seconds.

Eight (8) of the lead frames with a layer of nickel. were then plated with a layer of nickel phosphorous using the bath formulation disclosed in Table 4 below.

TABLE 4

| COMPONENT | CONCENTRATION |
|---|---|
| Nickel Sulfamate | 125 g/L |
| Phosphorous Acid | 50 g/L |
| Boric Acid | 30 g/L |
| Aminoacetic Acid | 25 g/L |
| Sulfonated Naphthalene Compound | 0.5 g/L |
| Diglyceryl Ether | 35 mg/L |
| Water | Balance |

The nickel phosphorous bath had a pH of 1 and was at a temperature of 55° C. during electroplating. Nickel phosphorous deposition was done in a Hull cell with paddle agitation at current densities of 5 ASD to 10 ASD. Electroplating was done on the eight nickel plated lead frames over a period of 16 seconds to 94 seconds. The thickness of the nickel phosphorous layers ranged from 0.1 micron to 1 micron.

All nine of the lead frames were then electroplated in a Hull cell containing a tin electroplating bath to form a bright tin layer on each of the lead frames. The tin bath included 60 g/L of tin ions from methane sulfonate and 250 ml/L of 70% methane sulfonic acid as the matrix. Tin plating was done at room temperature at a current density of 10 ASD for 30 seconds.

All nine of the tin plated lead frames were placed in a Sikama Falcon™ 8500 conduction/convection oven to reflow their tin layers. The temperature profile was 125° C. to 180° C. to 240° C. to 260° C. to 240° C. and then cooled down to room temperature. Each lead frame remained in each temperature zone for 30 seconds.

After reflow, the lead frames were examined for surface oxidation of the tin layer after being exposed to air for 24 hours. A visual inspection scale of 0 to 5 was used. If no visible oxidation was observed, the lead frame was rated 0; and if there was serious discoloration, the lead frame was given a 5. The lead frame which was plated with the nickel layer and not the nickel phosphorous was rated 5. The lead frame had purple stains across its surface. The remaining eight lead frames plated with the duplex of nickel phosphorous layer over the nickel layer were rated 1. Each had some white discoloration but did not show the severe discoloration as the lead frame which did not have the duplex layer. The results showed that the inclusion of a nickel phosphorous layer over a nickel layer reduced tin surface oxidation in contrast to a lead frame without the duplex layer.

EXAMPLE 3

The process disclosed in Example 1 above is repeated except that each lead frame is electroplated at a current density of 10 ASD in a tin copper alloy plating bath to form a tin copper alloy layer on the nickel phosphorous layers. The tin copper alloy plating bath includes 50 g/L of tin as tin(II) methane sulfonate; 1 g/L of copper as copper(II) methane sulfonate; 160 g/L free methane sulfonic acid, 27 g/L of ethoxylated beta naphthol; 7 g/L of ethoxylated bisphenol A, 1 g/L of a brightener; 3 g/L of methacrylic acid; 0.8 g/L of a grain refiner and 5 g/L of carboxymethylated polyethylene-imine having a molecular weight of 50,000 Daltons and a degree of carboxylation of 80%, sold under the tradename TRILON ES9300.

After reflow and exposure to the air for 24 hours, no oxidation is expected to be observed on the tin copper surface for the lead frames having the nickel and nickel phosphorous duplex. In contrast, the tin copper layer on the lead frame only having the nickel layer is expected to show oxidation.

EXAMPLE 4

The process described in Example 2 is repeated except that the lead frames are plated with a tin silver alloy layer instead of a tin layer. Each lead frame is plated with a tin silver layer at a current density of 50 ASD. The tin silver alloy bath includes 50 g/L of tin as tin methane sulfonate; 1.5 g/L of silver as silver methane sulfonate; 6 g/L of thiourea; 200 ml/L of methane sulfonic acid; 2 g/L of polyalkoxylate; 0.25 g/L ethylmaltol and 0.25 g/L of 3-methyl-1,2-cyclopentanone.

After reflow and exposure to air for 24 hours, no oxidation is expected to be observed on the tin silver surface for the lead frames having the nickel and nickel phosphorous duplex. In contrast, the tin silver layer on the lead frame only having the nickel layer is expected to show oxidation.

EXAMPLE 5

The process described in Example 2 is repeated except that the lead frames are plated with a tin lead alloy layer instead of tin. Each lead frame is plated with a tin lead layer at a current density of 5 ASD. The tin lead alloy bath includes 40 g/L of tin from tin methane sulfonate; 26 g/L of lead from lead methane sulfonate and 200 ml/L of methane sulfonic acid.

After reflow and exposure to air for 24 hours, no oxidation is expected to be observed on the tin lead surface for the lead frames having the nickel and nickel phosphorous duplex. In contrast, the tin lead layer on the lead frame only having the nickel layer is expected to show oxidation.

What is claimed is:

1. A method comprising electrolytically depositing a nickel layer on a substrate, electrolytically depositing a nickel phosphorous layer on the nickel layer to form a nickel and nickel phosphorous duplex layer, and depositing a tin or tin alloy layer on the nickel phosphorous layer of the duplex layer, the duplex layer is 2 microns to 3 microns thick, and reflowing the tin or tin alloy layer in a plurality of temperature zones within a temperature range of 100° C. to 350° C. followed by cooling the reflowed tin or tin alloy layer to room temperature.

2. The method of claim 1, wherein a phosphorous content of the nickel phosphorous layer is 0.1 wt % to 15 wt %.

3. The method of claim 2, wherein the phosphorous content of the nickel phosphorous layer is 3 wt % to 8 wt %.

4. The method of claim 1, wherein the tin or tin alloy layer remains in a temperature zone for 20 seconds to 50 seconds.

* * * * *